US007983369B2

(12) United States Patent
Lee

(10) Patent No.: US 7,983,369 B2
(45) Date of Patent: Jul. 19, 2011

(54) CIRCUIT FOR OUTPUTTING DATA OF SEMICONDUCTOR MEMORY APPARATUS

(75) Inventor: Kang Youl Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 810 days.

(21) Appl. No.: 11/963,489

(22) Filed: Dec. 21, 2007

(65) Prior Publication Data

US 2009/0003500 A1    Jan. 1, 2009

(30) Foreign Application Priority Data

Jun. 28, 2007  (KR) .................. 10-2007-0064636

(51) Int. Cl.
*H04L 7/00*  (2006.01)
(52) U.S. Cl. ....................................... 375/354
(58) Field of Classification Search .......... 375/354, 375/152; 365/193, 230.03, 233.5, 189.05; 327/161, 162
See application file for complete search history.

(56) References Cited

U.S. PATENT DOCUMENTS

| 6,429,683 | B1* | 8/2002 | Miller et al. ............... 326/80 |
| 7,053,679 | B2 | 5/2006 | Rho |
| 7,151,392 | B2 | 12/2006 | Lee |
| 7,236,012 | B2 | 6/2007 | Cho et al. |
| 2006/0139060 | A1* | 6/2006 | Kim .................. 326/83 |
| 2006/0158224 | A1 | 7/2006 | Yan-Bin |
| 2007/0008006 | A1 | 1/2007 | Na |
| 2007/0057691 | A1 | 3/2007 | Lee |
| 2008/0074937 | A1* | 3/2008 | Yang ................... 365/194 |

FOREIGN PATENT DOCUMENTS

| JP | 2000228085 | 8/2000 |
| JP | 2006-246425 | 9/2006 |
| JP | 2007-097136 | 4/2007 |
| JP | 2007-097142 | 4/2007 |
| JP | 2007-166603 | 6/2007 |
| KR | 1020000014392 A | 3/2000 |
| KR | 1020010068246 A | 7/2001 |
| KR | 1020060130440 A | 12/2006 |

* cited by examiner

*Primary Examiner* — Khai Tran
(74) *Attorney, Agent, or Firm* — Baker & McKenzie LLP

(57) ABSTRACT

A data output circuit of a semiconductor memory apparatus can include a clock synchronization unit (which is driven by a power supply voltage) that can be configured to receive data and output first synchronization data and second synchronization data in synchronization with a clock; a voltage converting unit that can be configured to convert the first and second synchronization data, which can swing between the power supply voltage and a ground voltage, into first and second converted data, which can swing between an I/O power supply voltage and the ground voltage; and a data output driver, which is driven by the I/O power supply voltage, for outputting the first converted data and the second converted data as output data.

16 Claims, 5 Drawing Sheets

_US 7,983,369 B2_

CIRCUIT FOR OUTPUTTING DATA OF SEMICONDUCTOR MEMORY APPARATUS

CROSS-REFERENCES TO RELATED APPLICATION

The present application claims priority under 35 U.S.C. 119(a) or 365 to Korean application number 10-2007-0064636, filed on Jun. 28, 2007, which is incorporated herein by reference as if set forth in full.

BACKGROUND

1. Technical Field

The embodiments described herein relate to a semiconductor memory apparatus and, more particularly, to a circuit for outputting data in a semiconductor memory apparatus.

2. Related Art

As shown in FIG. 1, a conventional data output circuit of a semiconductor memory apparatus includes a clock synchronization unit 10 and a data output driver 20.

The clock synchronization unit 10 receives data and outputs first synchronization data "data_clk1" and second synchronization "data data_clk2" in synchronization with rising and falling clocks "Rclk" and "Fclk". The data output driver 20 generates output data "DQ" by driving the first synchronization data "data_clk1" and the second synchronization data "data_clk2."

At this time, the clock synchronization unit 10 is configured to receive a power supply voltage (VDD) as a driving voltage thereof. The data output driver 20 is configured to receive a power supply voltage for inputting/outputting data (VDDQ) (hereinafter, I/O power supply voltage) as a driving voltage thereof. Although the power supply voltage (VDD) and the I/O power supply voltage (VDDQ) have the same target voltage level, the power source of the power supply voltage (VDD) is different from that of the I/O power supply voltage (VDDQ). Although the two voltages have the same target voltage level from different power sources, they have different characteristics of noises according to the number of operating circuits. Thus, if the level difference between the two voltages occurs due to their different noise characteristics, there occurs a problem in that bits of the output data "DQ" are overlapped.

Referring to FIG. 2, in case of the first synchronization data "data_clk1" if the power supply voltage (VDD) becomes higher than the I/O power supply voltage (VDDQ), the phase of the first synchronization "data data_clk1" lags behind that of the output data "DQ". Meanwhile, if the power supply voltage (VDD) becomes lower than the I/O power supply voltage (VDDQ), the phase of the output data "DQ" lags behind that of the first synchronization data "data_clk1."

Since the data output driver 20 outputs the output data "DQ" to the same node in response to the first synchronization data "data_clk1" and the second synchronization data "data_clk2," there can be caused a problem in that the bits of the output data "DQ" can be overlapped.

SUMMARY

Certain embodiments disclosed herein are directed to providing a circuit for stably outputting data to the outside in a semiconductor memory apparatus.

In one aspect, a data output circuit of a semiconductor memory apparatus can include a clock synchronization unit (which is driven by a power supply voltage) that can be configured for receiving data and outputting first synchronization data and second synchronization data in synchronization with a clock; a voltage converting unit that can be configured to convert the first and second synchronization data, which can swing between the power supply voltage and a ground voltage, into first and second converted data, which can swing between an I/O power supply voltage and the ground voltage; and a data output driver (which is driven by the I/O power supply voltage) that can be configured to output the first converted data and the second converted data as output data.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
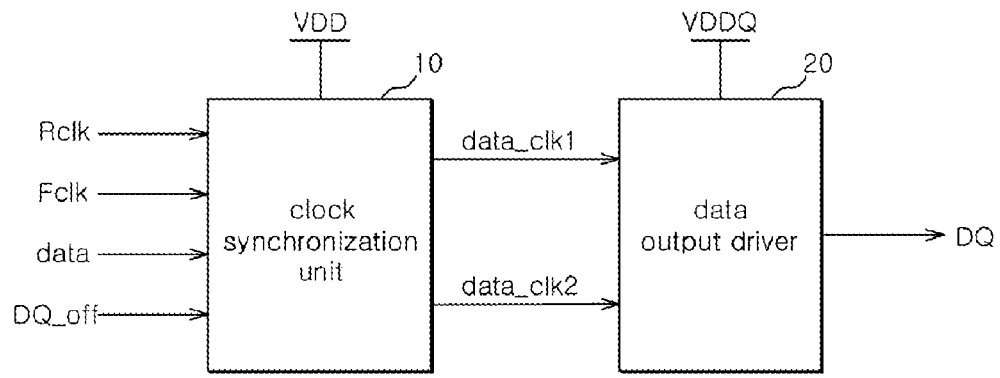
FIG. 1 is a block diagram of an exemplary data output circuit in a semiconductor memory apparatus.
Figure 2:
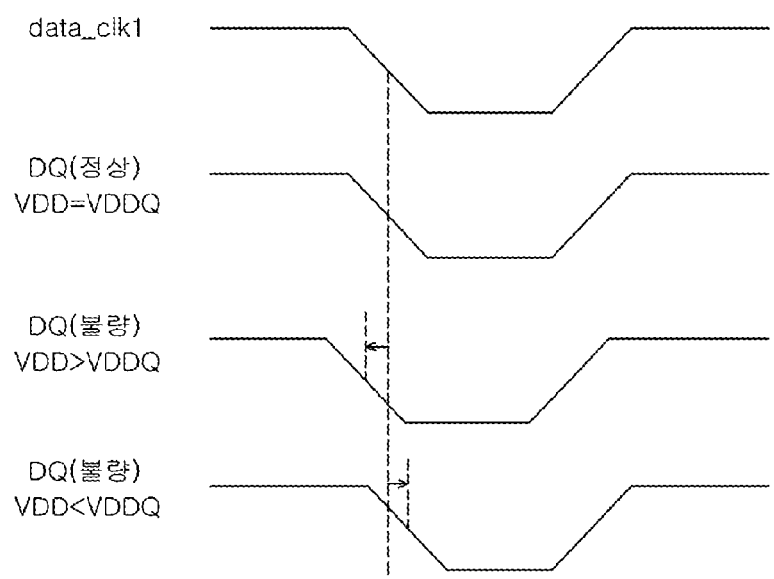
FIG. 2 is a timing view of the data output circuit of FIG. 1.
Figure 3:
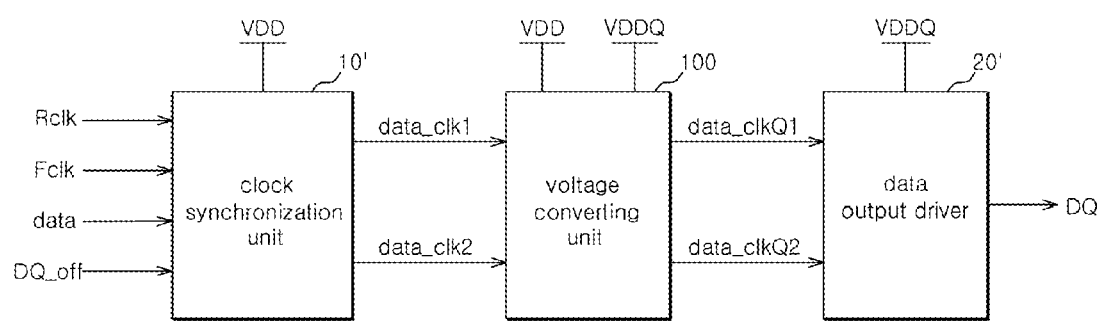
FIG. 3 is a block diagram of a data output circuit in a semiconductor memory apparatus according to one embodiment.

As shown in FIG. 3, a data output circuit of a semiconductor memory apparatus can include a clock synchronization unit 10', a voltage converting unit 100 and a data output driver 20'.

The clock synchronization unit 10' can be configured to generate first synchronization data "data_clk1" and second synchronization data "data_clk2" in response to a rising clock "Rclk" and a falling clock "Fclk." Also, the clock synchronization unit 10' can be configured to output constant level signals as the first and second synchronization "data data_clk1" and "data_clk2" in response to a data output cancellation signal "DQ_off".

The clock synchronization unit 10' can be configured to use a power supply voltage (VDD) as a driving voltage. Thus, the first synchronization "data data_clk1" and the second synchronization data "data_clk2" can swing between the power supply voltage (VDD) and a ground voltage (VSS).

The voltage converting unit 100 can be configured to generate first and second converted data "data_clkQ1" and "data_ clkQ2" in response to the first and second synchronization "data data_clk1" and "data_clk2," respectively. The voltage converting unit 100 can be further configured to use both the power supply voltage (VDD) and an I/O power supply voltage (VDDQ) as driving voltages. The I/O power supply voltage (VDDQ) can be a power supply voltage used for inputting/outputting a data. For example, the voltage converting unit 100 can be configured to convert the first synchronization data "data_clk1" and the second synchronization data "data_clk2," which can swing between the power supply voltage (VDD) and the ground voltage (VSS), into the first converted data "data_clkQ1" and the second converted data "data_clkQ2," which can swing between the I/O power supply voltage (VDDQ) and the ground voltage (VSSQ).

The data output driver 20' can be configured to output data "DQ" to one node in response to the first converted data "data_clkQ1" and the second converted data "data_clkQ2."

Figure 4:
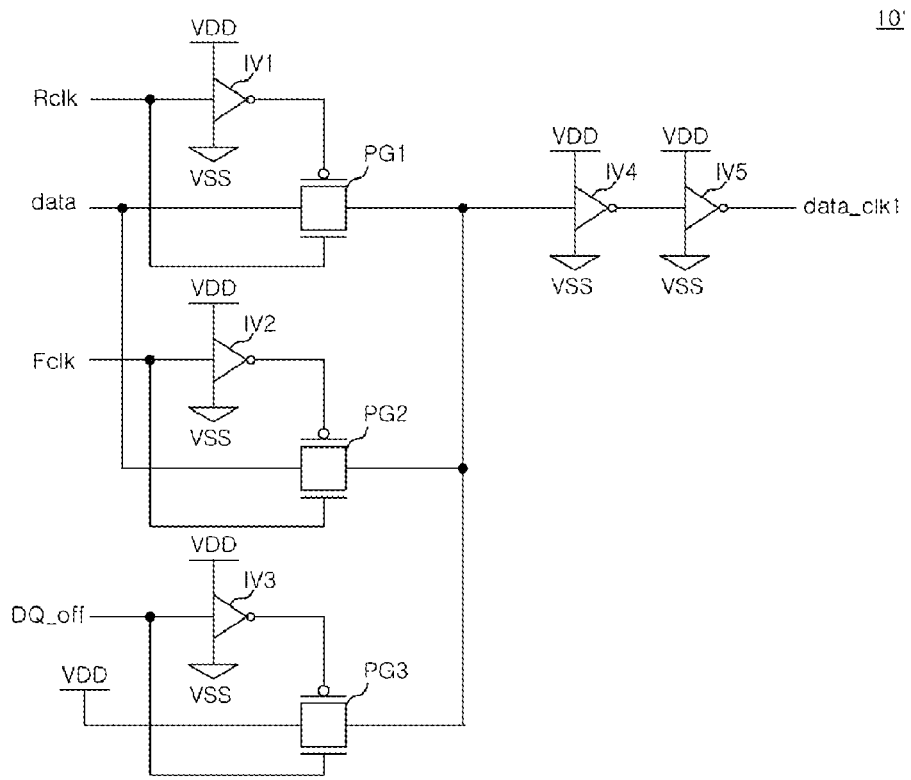
FIG. 4 is a circuit diagram of a clock synchronization unit included in the circuit of FIG. 3.
Figure 4:
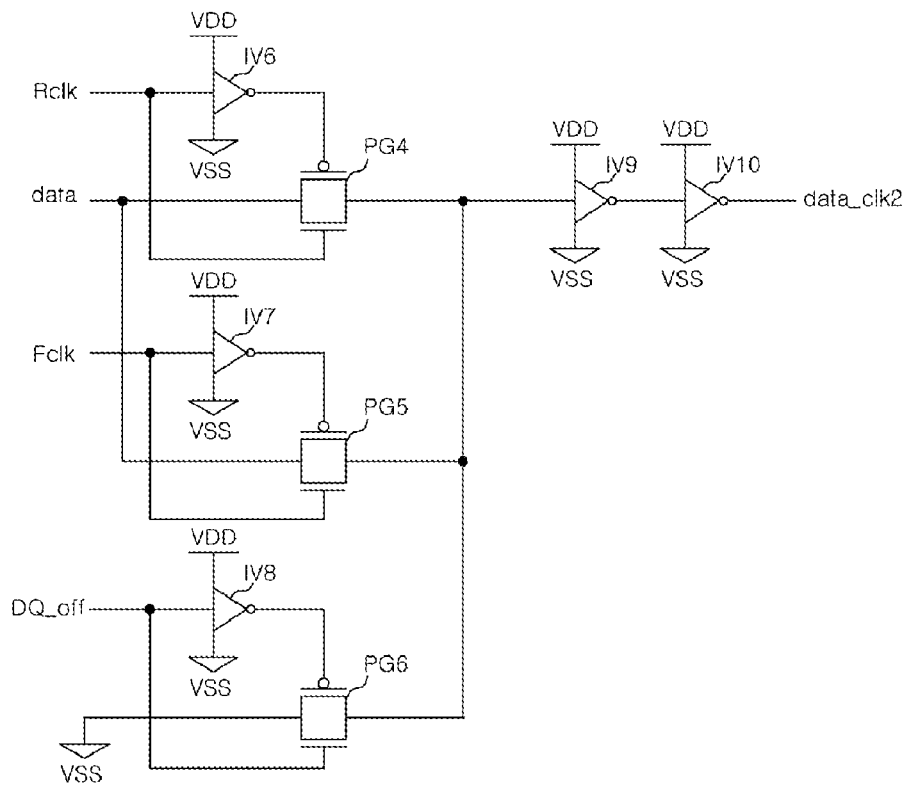

As shown in FIG. 4, the clock synchronization unit 10' can include first to tenth inverters (IV1) to (IV10) and first to sixth path gates (PG1) to (PG6). At this time, the first to tenth inverters (IV1) to (IV10) can be driven by the power supply voltage (VDD).

The first inverter (IV1) can be configured to receive the rising clock "Rclk." The second inverter (IV2) can be configured to receive the falling clock "Fclk." The third inverter (IV3) can be configured to receive the data output cancellation signal "DQ_off". The first path gate "PG1" can be configured to output data in response to an output signal of the first inverter (IV1) and the rising clock "Rclk." At this time, the first path gate (PG1) can be turned on during a high level section of the rising clock "Rclk." The second path gate (PG2) can be configured to output data in response to an output signal of the second inverter (IV2) and the falling clock "Fclk." At this time, the second path gate (PG2) can be turned on during a high level section of the falling clock "Fclk." The third path gate (PG3) can be configured to output the power supply voltage (VDD) in response to an output signal of the third inverter (IV3) and the data output cancellation signal "DQ_off". At this time, the third path gate (PG3) can be configured to output the power supply voltage (VDD) when the data output cancellation signal "DQ_off" is activated, that is, in a high level. The output terminals of the first to third path gates (PG1) to (PG3) can be connected to a common node. The fourth inverter (IV4) can receive a signal from the common node to which the output terminals of the first to third path gates (PG1) to (PG3) can be connected. The fifth inverter (IV5) can be configured to receive an output signal of the fourth inverter (IV4) to output the first synchronization data "data_clk1."

The sixth inverter (IV6) can be configured to receive the rising clock "Rclk." The seventh inverter (IV7) can be configured to receive the falling clock "Fclk." The eighth inverter (IV8) can be configured to receive the data output cancellation signal "DQ_off". The fourth path gate (PG4) can be configured to output data in response to an output signal of the sixth inverter (IV6) and the rising clock "Rclk." At this time, the fourth path gate (PG4) can be turned on during a high level section of the rising clock "Rclk." The fifth path gate (PG5) can be configured to output data in response to an output signal of the seventh inverter (IV7) and the falling clock "Fclk." At this time, the fifth path gate (PG5) can be turned on during a high level section of the falling clock "Fclk." The sixth path gate (PG6) can be configured to output the ground voltage (VSS) in response to an output signal of the eighth inverter (IV8) and the data output cancellation signal "DQ_off". At this time, the sixth path gate (PG6) can be configured to output the ground voltage (VSS) when the data output cancellation signal "DQ_off" is activated, that is, in a high level. The output terminals of the fourth to sixth path gates (PG4) to (PG6) can be connected to a common node. The ninth inverter (IV9) can be configured to receive a signal from the common node to which the output terminals of the fourth to sixth path gates (PG4) to (PG6) can be connected. The tenth inverter (IV10) can be configured to receive an output signal of the ninth inverter (IV9) to output the second synchronization data "data_clk2."

Figure 5:
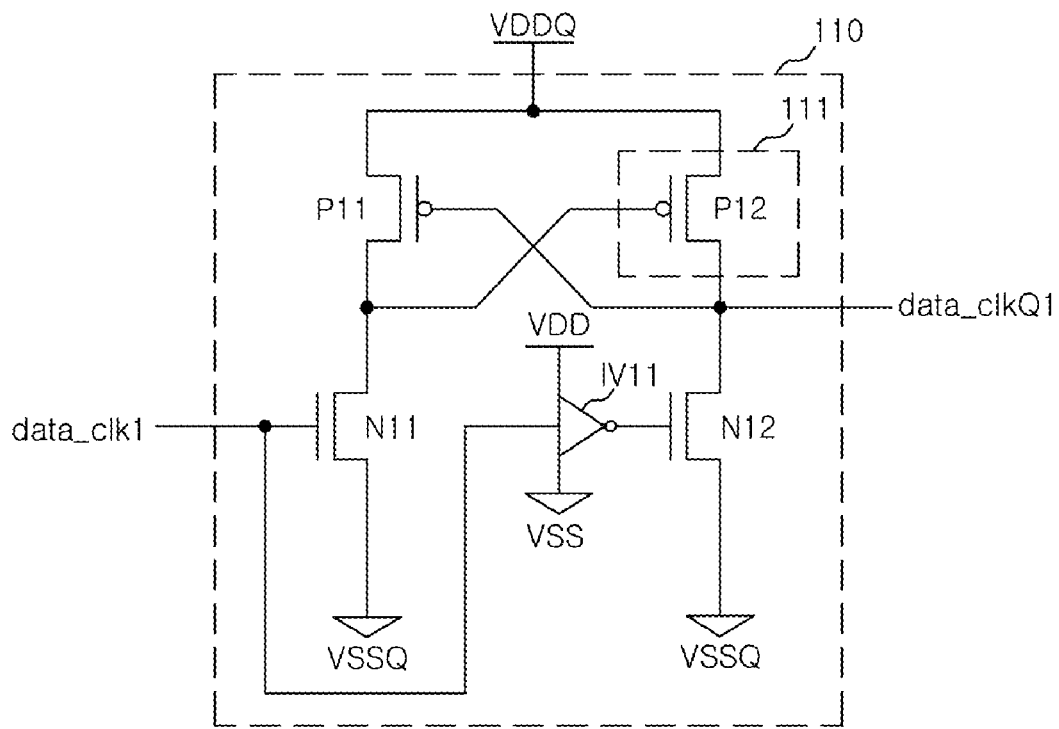
FIG. 5 is a circuit diagram of a voltage converting unit of included in the circuit FIG. 3.
Figure 5:
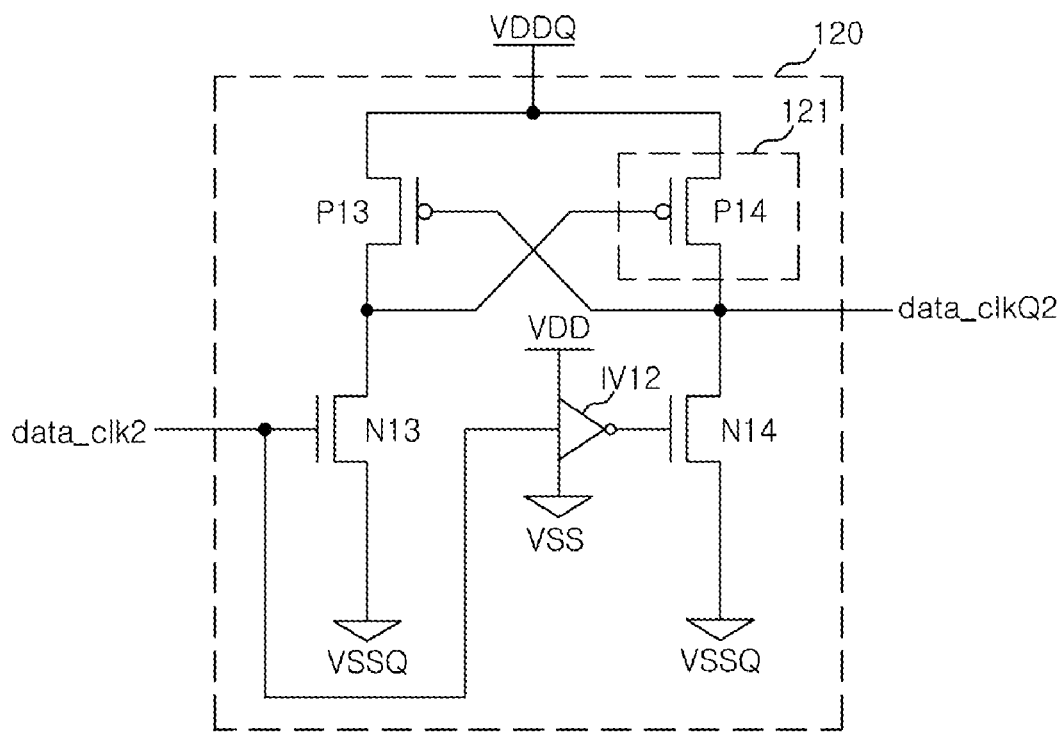

As shown in FIG. 5, the voltage converting unit 100 can include a first converting unit 110 and a second converting unit 120.

The first converting unit 110 can be configured to convert the first synchronization data "data_clk1" which swings between the power supply voltage (VDD) and the ground voltage (VSS), into the first converted data "data_clkQ1" which can swing between the I/O power supply voltage (VDDQ) and the ground voltage (VSSQ).

The first converting unit 110 is a level shifter which can include first to fourth transistors (N11), (P11), (N12) and (P12) and an eleventh inverter (IV11). The first transistor (N11) can include a gate which receives the first synchronization data "data_clk1" and a source which can be connected to the ground voltage (VSSQ). The second transistor (P11) can include a source which receives the I/O power supply voltage (VDDQ) and a drain which can be connected to the drain of the first transistor (N11). The eleventh inverter (IV11) can receive the first synchronization data "data_clk1". The third transistor (N12) can include a gate which can receive an output signal of the eleventh inverter (IV11) and a source which can be connected to the ground voltage (VSSQ). The fourth transistor (P12) can include a gate which can be connected to a node to which the first and second transistors (N11) and (P11) can be commonly connected, a source which can receive the I/O power supply voltage (VDDQ) and a drain which can be connected to the drain of the third transistor (N12). At this time, a node to which the third and fourth transistors (N12) and (P12) can be commonly connected can be connected to the gate of the second transistor (P11). Also, the first converted data "data_clkQ1" can be outputted from the node to which the third and fourth transistors (N12) and (P12) can be connected. At this time, when the first transistor (N11) can be turned on, the fourth transistor (P12), as a first driver 111, can be configured to drive the potential level of the first converted data "data_clkQ1" to the voltage level correspondent to the I/O power supply voltage (VDDQ).

The second converting unit 120 can be configured to convert the second synchronization data "data_clk2," which can swing between the power supply voltage (VDD) and the ground voltage (VSS), into the second converted data "data_clkQ2" which can swing between the I/O power supply voltage (VDDQ) and the ground voltage (VSS).

The second converting unit 120 can be a level shifter which can include fifth to eighth transistors (N13), (P13), (N14) and (P14) and a twelfth inverter (IV12). The fifth transistor (N13) can include a gate which receives the second synchronization data "data_clk2" and a source which can be connected to the ground voltage (VSSQ). The sixth transistor (P13) can include a source which receives the I/O power supply voltage (VDDQ) and a drain which can be connected to the drain of the fifth transistor (N13). The twelfth inverter (IV12) can receive the second synchronization data "data_clk2." The seventh transistor (N14) can include a gate which receives an output signal of the twelfth inverter (IV12) and a source which can be connected to the ground voltage (VSSQ). The eighth transistor (P14) can include a gate which can be connected to a node to which the fifth and sixth transistors (N13) and (P13) can be commonly connected, a source which receives the I/O power supply voltage (VDDQ) and a drain which can be connected to the drain of the seventh transistor (N14). At this time, a node to which the seventh and eighth transistors (N14) and (P14) can be commonly connected can be connected to the gate of the sixth transistor (P13). Also, the second converted data "data_clkQ2" can be outputted from the node to which the seventh and eighth transistors (N14) and (P14) can be connected. At this time, when the fifth transistor (N13) is turned on, the eighth transistor (P14), as a second driver 121, can be configured to drive the potential level of the second converted data "data_clkQ2" to the voltage level correspondent to the I/O power supply voltage (VDDQ).

Figure 6:
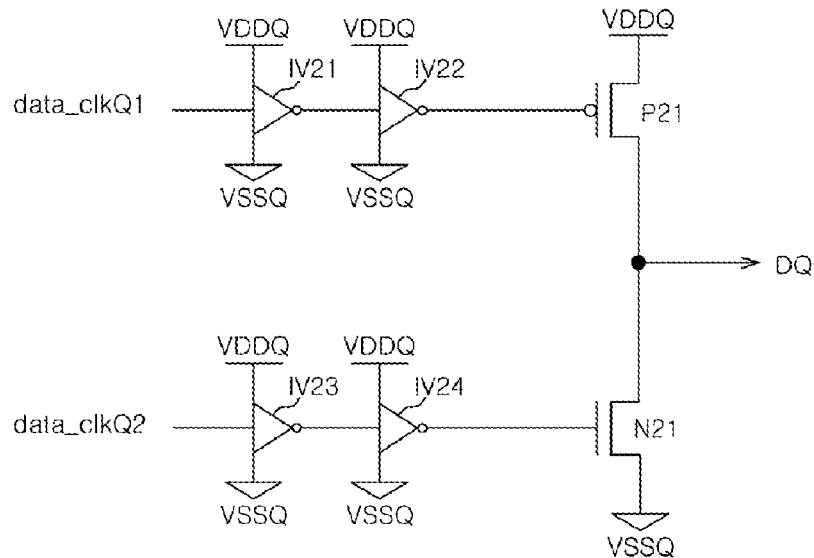
FIG. 6 is a circuit diagram of a data output driver included in the circuit of FIG. 3.

As shown in FIG. 6, the data output driver 20' can include thirteenth to sixteenth inverters (IV21) to (IV24) and ninth and tenth transistors (P21) and (N21). The thirteenth inverter (IV21) can receive the first converted data "data_clkQ1." The fourteenth inverter (IV22) can receive an output signal of the thirteenth inverter (IV21). The fifteenth inverter (IV23) can receive the second converted data "data_clkQ2." The sixteenth inverter (IV24) can receive an output signal of the fifteenth inverter (IV23). The ninth transistor (P21) can include a gate which can receive an output signal of the fourteenth inverter (IV22) and a source which can receive the I/O power supply voltage (VDDQ). The tenth transistor (N21) can include a gate which receives an output signal of the sixteenth inverter (IV24), a source which can be connected to the ground voltage (VSSQ) and a drain which can be connected to the drain of the ninth transistor (P21). At this time, the output data "DQ" can be output to the node to which the ninth and tenth transistors (P21) and (N21) are connected.

The operation of the data output circuit of a semiconductor memory apparatus, in accordance with one embodiment, will be described below.

Referring to FIG. 4, when the semiconductor memory apparatus does not output the data, the data output cancellation signal "DQ_off" can be activated in a high level. Thus, the first synchronization data "data_clk1" can be output as the signals which are constantly in a high level and the second synchronization data "data_clk2" can be outputted as the signals which are constantly in a low level. Accordingly, the ninth and tenth transistors (P21) and (N21) in the data output driver 20' of FIG. 6 can be turned off so that the data output driver 20' does not generate a signal of any level.

When the semiconductor memory apparatus outputs the data, the data can be output as the first synchronization data "data_clk1" and the second synchronization data "data_clk2" whenever the levels of the rising clock "Rclk" and the falling clock "Fclk" becomes high. At this time, the first synchronization data "data_clk1" and the second synchronization data "data_clk2" can have a swing width which is between the power supply voltage (VDD) and the ground voltage (VSS).

Referring to FIG. 5, if the potential level of the first synchronization data "data_clk1" is the voltage level of the power supply voltage (VDD), the first transistor (N11) can be turned on. The drain of the turned-on first transistor (N11) can be connected to the ground voltage (VSS). The fourth transistor (P12), of which the gate is connected to the drain of the first transistor (N11), can be turned on so that the potential level of the first converted data "data_clkQ1" can become the voltage level of the I/O power supply voltage (VDDQ). At this time, if the I/O power supply voltage (VDDQ) becomes lower than the power supply voltage (VDD), the source voltage of the fourth transistor (P12), which receives the I/O power supply voltage (VDDQ), can become lower. Thus, if the gate voltage of the fourth transistor (P12) when the I/O power supply voltage (VDDQ) becomes lower than the power supply voltage (VDD) is lower than that when the power supply voltage (VDD) is the same as the I/O power supply voltage (VDDQ), the fourth transistor P12 can be turned on. For example, if the threshold voltage of the fourth transistor (P12) is 0.7V and the source voltage of the fourth transistor (P12) is lowered from 1.5V to 1.3V, the gate voltage of the fourth transistor (P12) should be lowered from 0.8V to less than 0.6V in order to turn on the fourth transistor (P12).

If the I/O power supply voltage (VDDQ) becomes lower than the power supply voltage (VDD), the fourth transistor (P12) can be turned on later than when the power supply voltage (VDD) is the same as the I/O power supply voltage (VDDQ). This can also be applied to the second converting unit 120 having the same structure as the first converting unit 110. Thus, if the I/O power supply voltage (VDDQ) becomes lower than the power supply voltage VDD, the eighth transistor (P14) can also be turned on late. That is, the response speed, at which the voltage converting unit 100 converts the first synchronization data "data_clk1" and the second synchronization data "data_clk2" into the first converted data "data_clkQ1" and the second converted data "data_clkQ2," becomes slower.

In the conventional data output circuit, when the power supply voltage (VDD) becomes lower than the I/O power supply voltage (VDDQ), the phase of the first synchronization data "data_clk1" can lag behind that of the output data "DQ." However, in the data output circuit, since the fourth transistor (P12) can be turned on late, the phase of the output data "DQ" can be the same as that of the first synchronization data "data_clk1." This is also applied to the second synchronization data "data_clk2."

When the potential level of the first synchronization data "data_clk1" has the voltage level correspondent to the power supply voltage (VDD) and the I/O power supply voltage (VDDQ) is higher than the power supply voltage (VDD), the source voltages of the fourth and eighth transistors (P12) and (P14) can be elevated. Thus, the fourth and eighth transistors (P12) and (P14) can be turned on earlier. That is, the response speed, at which the voltage converting unit 100 can be configured to convert the first synchronization data "data_clk1" and the second synchronization data "data_clk2" into the first converted data "data_clkQ1" and the second converted data "data_clkQ2," can become faster.

In the conventional data output circuit, when the I/O power supply voltage (VDDQ) becomes higher than the power supply voltage (VDD), the phase of the output data "DQ" can lag behind that of the first synchronization data "data_clk1" and the second synchronization data "data_clk2." However, in a data output circuit configured as described herein, since the fourth and eighth transistors (P12) and (P14) can be turned on earlier, the phase of the output data "DQ" can be the same as that of the first synchronization data "data_clk1" and the second synchronization data "data_clk2."

Therefore, the first and second converting units 110 and 120 of FIG. 5 can be control units since they can be configured to control the output timing of the data output driver 20'.

In certain embodiments, the data output circuit can be configured to output the output data "DQ" even if a voltage difference between the power supply voltage (VDD) and the I/O power supply voltage (VDDQ) occurs.

Figure 7:
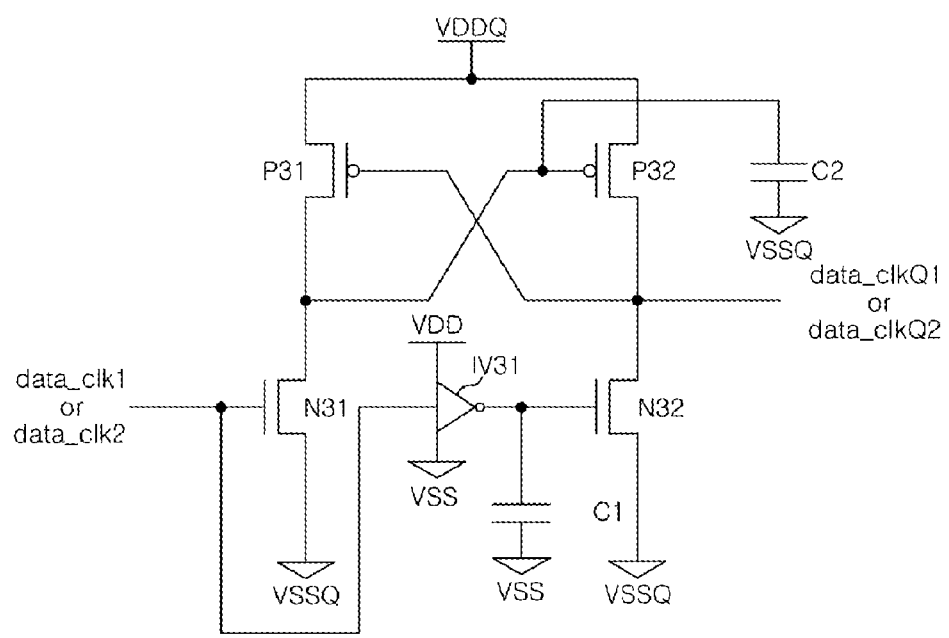
FIG. 7 is a circuit diagram of the voltage converting unit included in the circuit of FIG. 3.

As shown in FIG. 7, capacitors (C1) and (C2) can be connected to the gates of transistors (P32) and (N32) which are positioned in the output of the first synchronization data "data_clk1" and the second synchronization data "data_clk2" so that the first and second converting units 110 and 120 can be configured to control the timing when the transistors (P32) and (N32) are turned on.

A data output circuit configured as described herein stably outputs data to the outside of the semiconductor memory apparatus, thereby improving the reliability of the semiconductor memory apparatus.

Although the semiconductor memory apparatus including the data output circuit configured as described herein is a DDR SDRAM which outputs data using a rising clock and a falling clock, the embodiments described herein can be also applied to a SDRAM which outputs data using a single clock. That is, the data output circuit according to the embodiments described herein can be easily embodied even in the SDRAM which outputs single data using a single clock, namely, a rising clock.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data output circuit of a semiconductor memory apparatus, comprising:
   a clock synchronization unit, which is driven by a power supply voltage, for receiving data and synchronizing the data with a clock thereby outputting the synchronized data as a first synchronization data and a second synchronization data, wherein the first synchronization data and the second synchronization data swing between the power supply voltage and a ground voltage;
   a voltage converting unit for converting the first and second synchronization data into first and second converted data, which swing between an I/O power supply voltage and the ground voltage; and
   a data output driver, which is driven by the I/O power supply voltage, for driving the first converted data and the second converted data as output data,
   wherein the power supply voltage and the I/O power supply voltage have the same voltage level from different power sources.

2. The circuit of claim 1, wherein the first converted data has a potential level of the I/O power supply voltage when a potential level of the first synchronization data has a voltage level of the power supply voltage, and
   wherein the second converted data has a potential level of the I/O power supply voltage when a potential level of the second synchronization data is a voltage level correspondent to the power supply voltage.

3. The circuit of claim 2, wherein the voltage converting unit includes:
   a first converting unit for generating the first converted data in response to the first synchronization data; and
   a second converting unit for generating the second converted data in response to the second synchronization data.

4. The circuit of claim 3, wherein the first converting unit includes a level shifter which is driven by the power supply voltage and the I/O power supply voltage.

5. The circuit of claim 3, wherein the second converting unit includes a level shifter which is driven by the power supply voltage and the I/O power supply voltage.

6. A data output circuit of a semiconductor memory apparatus, comprising:
   clock synchronization unit, which is driven by a power supply voltage, for receiving data and outputting first and second synchronization data in synchronization with a clock;
   control unit for controlling a turn-on timing of a driver according to a voltage level difference between the power supply voltage and an I/O power supply voltage, wherein the driver is embedded in the control unit in order to output the first and second synchronization data as first and second converted data, respectively; and
   a data output driver, which is driven by the I/O power supply voltage, for driving the first and second converted data to output the first and second converted data, respectively, as output data.

7. The circuit of claim 6, wherein the power supply voltage and the I/O power supply voltage have the same voltage level from different power sources.

8. The circuit of claim 6,
   wherein, when a power supply voltage is higher than a I/O power supply voltage, the turn-on timing of the driver is slower than that of the driver of when the power supply voltage is same as the I/O power supply voltage,
   when the power supply voltage is lower than the I/O power supply voltage, the turn-on timing of the driver is faster than that of the driver of when the power supply voltage is same as the I/O power supply voltage.

9. The circuit of claim 8, wherein the control unit includes:
   a first converting unit for generating the first converted data in response to the first synchronization data; and
   a second converting unit for generating the second converted data in response to the second synchronization data.

10. The circuit of claim 9, wherein the first converting unit includes the driver for outputting the first converted data,
    wherein the first converting unit is configured to control a driving timing so that the driving timing of the driver is slower than that of the driver in case the power supply voltage is same as the I/O power supply voltage, when the power supply voltage is higher than the I/O power supply voltage, and the first synchronization data has a voltage level of the power supply voltage,
    wherein the driving timing of driver is timing that the first converted data is converted to the I/O power supply voltage level.

11. The circuit of claim 10, wherein the first converting unit is configured to control a driving timing so that the driving timing of the driver is faster than that of the driver in case the power supply voltage is same as the I/O power supply voltage, when the power supply voltage is lower than the I/O power supply voltage, and the first synchronization data has a voltage level of the power supply voltage,
    wherein the driving timing of driver is timing that the first converted data is converted to the I/O power supply voltage level.

12. The circuit of claim 9, wherein the second converting unit includes the driver for outputting the second converted data,
    wherein the second converting unit is configured to control a driving timing so that the driving timing of the driver is slower than that of the driver in case the power supply voltage is same as the I/O power supply voltage, when the power supply voltage is lower than the I/O power supply voltage, and the second synchronization data has a voltage level of the power supply voltage,
    wherein the driving timing of driver is timing that the second converted data is converted to the I/O power supply voltage level.

13. The circuit of claim 12, wherein the second converting unit is configured to control a driving timing so that the driving timing of the driver is slower than that of the driver in case the power supply voltage is same as the I/O power supply voltage, when the power supply voltage is lower than the I/O power supply voltage, and the second synchronization data has a voltage level of the power supply voltage,
    wherein the driving timing of driver is timing that the second converted data is converted to the I/O power supply voltage level.

14. A data output circuit of a semiconductor memory apparatus, comprising:
- clock synchronization unit, which is driven by a power supply voltage, for receiving data and outputting synchronization data in synchronization with a clock;
- voltage converting unit for converting the synchronization data, which swings between the power supply voltage and a ground voltage, into converted data which swings between an I/O power supply voltage and the ground voltage; and
- a data output driver, which is driven by the I/O power supply voltage, for driving the converted data to output the converted data as output data,
- wherein the power supply voltage and the I/O power supply voltage have the same target voltage level from different power sources.

15. The circuit of claim 14, wherein the voltage converting unit generates the converted data which has a potential level of the I/O power supply voltage when a potential level of the converted data is the level of the power supply voltage.

16. The circuit of claim 15, wherein the voltage converting unit includes a level shifter which is driven by the power supply voltage and the I/O power supply voltage.

* * * * *